(12) United States Patent
Charles

(10) Patent No.: US 6,509,580 B2
(45) Date of Patent: Jan. 21, 2003

(54) SEMICONDUCTOR DEVICE WITH CURRENT CONFINEMENT STRUCTURE

(75) Inventor: Paul Marshall Charles, Bramford (GB)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/858,677

(22) Filed: May 16, 2001

(65) Prior Publication Data
US 2002/0093013 A1 Jul. 18, 2002

(30) Foreign Application Priority Data
Jan. 18, 2001 (EP) .............................. 01300447

(51) Int. Cl.$^7$ ..................... H01L 31/072; H01L 31/00; H01L 31/0336; H01L 31/0328; H01L 31/058
(52) U.S. Cl. ............................. 257/27; 257/21; 257/27; 257/183; 257/184; 257/187; 257/196; 442/461; 442/462; 442/463; 442/464; 442/465
(58) Field of Search ................. 257/183, 184, 257/187, 196, 442, 21, 27, 461–465

(56) References Cited

U.S. PATENT DOCUMENTS

| 4,425,650 A | * | 1/1984 | Mito et al. ..................... 372/46 |
| 5,452,315 A | * | 9/1995 | Kimura et al. ................. 372/46 |
| 5,561,681 A |   | 10/1996 | Nishimura .................... 372/46 |
| 5,602,862 A | * | 2/1997 | Barnsley et al. ............... 372/45 |
| 5,636,237 A |   | 6/1997 | Terakado et al. .............. 372/46 |
| 5,717,710 A |   | 2/1998 | Miyazaki et al. .............. 372/50 |
| 5,804,840 A |   | 9/1998 | Ochi et al. ..................... 257/94 |
| 5,832,019 A | * | 11/1998 | Paoli et al. .................... 372/46 |
| 2002/0042155 A1 | * | 4/2002 | Sakata ........................ 438/22 |

FOREIGN PATENT DOCUMENTS

| EP | 0 547 850 A1 | 6/1993 |
| EP | 0 639 875 A1 | 2/1995 |

OTHER PUBLICATIONS van der Linden, J.E., Examiner. European Search Report, Application No. EP 01 30 0447, dated Jun. 25, 2001.

* cited by examiner

Primary Examiner—Stephen D. Meier
Assistant Examiner—Ida M. Soward

(57) ABSTRACT

The present invention relates to a semiconductor device with one or more current confinement regions and to a method of manufacturing such a device, particularly buried heterostructure light emitting devices such as semiconductor lasers and light emitting diodes. The device comprises an active layer, a current conduction region, one or more current confinement regions adjacent the current conduction region. The current conduction region and current confinement region are arranged to channel an applied electric current to the active layer. The or each current confinement region includes both a metal-doped current blocking structure and a p-n junction current blocking structure. The p-n junction current blocking structure is between the current conduction region and the metal-doped current blocking structure.

7 Claims, 6 Drawing Sheets

SEMICONDUCTOR DEVICE WITH CURRENT CONFINEMENT STRUCTURE

BACKGROUND OF THE INVENTION

1. Field of the Invention

The present invention relates to a semiconductor device with one or more current confinement regions and to a method of manufacturing such a device, particularly buried heterostructure light emitting devices such as semiconductor lasers and light emitting diodes.

2. Description of the Prior Art

Buried heterostructure light emitting devices commonly have current confinement regions defined by areas of high resistivity that channel current to an optically active layer within the structure. In devices using InGaAsP/InP materials, current confinement regions have been employed based on a reverse-biased p-n or n-p diode structure. Such structures provide high resistivity, and low leakage currents, and are widely used in fibre optic communication systems across a range of operating frequencies. At operating frequencies about 1 GHz, however, the performance of such devices becomes limited by the capacitance of the current blocking structure, owing to the charge on the reverse biased diode junction.

Other current blocking structures have therefore been developed, for example Fe-doped InP-based layers, as described in U.S. Pat. No. 4,660,208. Such Fe-doped layers have a lower capacitance than structures based on a reverse biased junction, but do not have as high a resistivity. This lower resistivity also limits operation and device lifetime at high frequencies, because of the resulting higher device operating temperatures. In order to avoid excessive temperatures, it becomes necessary to use a lower drive voltage, and this in turn limits the achievable bandwidth of a device based on Fe-doped material.

SUMMARY OF THE INVENTION

In recent years there has been an increasing demand for fibre optic communication links having a bandwidth in excess of 1 GHz, for example up to 10 GHz. It is an object of the present invention to provide a semiconductor device that addresses these issues.

Accordingly, the invention provides a semiconductor device comprising an active layer, a current conduction region, one or more current confinement regions adjacent the current conduction region, the current conduction region and current confinement region being arranged to channel electric current to the active layer, wherein the or each current confinement region includes both a metal-doped current blocking structure and a p-n junction current blocking structure, the p-n current blocking structure being between the current conduction region and the metal-doped current blocking structure.

It has been found that the p-n current blocking structure nearest the current conduction region then provides high resistivity and good high frequency performance at high temperatures, while the reduction in the volume of the p-n current blocking structure and use of the metal-doped second current blocking structure further away from the current conduction region provides reduced parasitic capacitance.

In some type of device, for example buried heterostructure laser diodes, the device includes a substrate, a mesa stripe on the substrate and an active layer in the mesa stripe. The current conduction region then channels current through the active layer.

The mesa stripe may have one or more side walls that rise above the substrate. The active layer then extends to the side wall(s) and the active layer is covered at the side walls by the p-n blocking structure.

In preferred embodiments of the invention, the mesa side walls slope laterally away from the active layer towards the metal-doped current confinement structure. Also in a preferred embodiment, the metal-doped current confinement structure abuts the p-n current confinement structure along a substantially vertical interface.

Also according to the invention, there is provided a method of forming semiconductor device comprising an active layer, a current conduction region, one or more current confinement regions adjacent the current conduction region, the current conduction region and current confinement region being arranged to channel electric current to the active layer, wherein the method comprises the steps of:

i) growing upon a semiconductor substrate a plurality of semiconductor layers, including the active layer and the current conduction region by which electric current may be applied to the active layer;

ii) growing adjacent the active layer a p-n junction current blocking structure; and iii) growing adjacent the p-n junction current blocking structure a metal-doped current blocking structure, the p-n-junction current blocking structure and the metal-doped current blocking structure together forming a current confinement region for channelling electric current to the current conduction region.

In one embodiment of the invention, prior to step ii), a first etch mask is formed over the active layer, said first etch mask defining during an etching process an area of the active layer adjacent the current conduction region to be removed by the etching. Then, prior to step iii) a second etch mask is formed over the active layer and the p-n junction current blocking structure adjacent the current conduction region, said second etch mask defining during an etching process an area of p-n junction current blocking structure not adjacent the active layer to be removed by the etching.

This second etch mask may then remain in place during the growth of the metal-doped current blocking structure in step iii).

In order to achieve a sufficiently uniform width of the first current blocking structure, the second etch mask is then aligned laterally with the first etch mask, typically to an accuracy of about 10% to 20% of the width of the second etch mask. In one preferred embodiment of the invention, the second etch mask is laterally wider than the first etch mask.

In another embodiment of the invention, prior to step ii), an etch mask is formed over the active layer, said etch mask defining during a first etching process an area of the active layer adjacent the current conduction region to be removed by the etching. The etch mask remains during the growth of the p-n current blocking structure in step ii). Finally, the etch mask defines during a second etching process an area of the p-n junction current blocking structure not adjacent the active layer to be removed by the etching.

This etch mask may then remain in place during the growth of the metal-doped current blocking structure in step iii).

Because this process uses only one mask for the formation of the first current conduction structure and the second current conduction structure, the process is self-aligning for these two current blocking structures.

BRIEF DESCRIPTION OF THE DRAWINGS

The invention will now be described by way of example, with reference to the accompanying drawings, in which.

DESCRIPTION OF THE INVENTION

Figure 1:
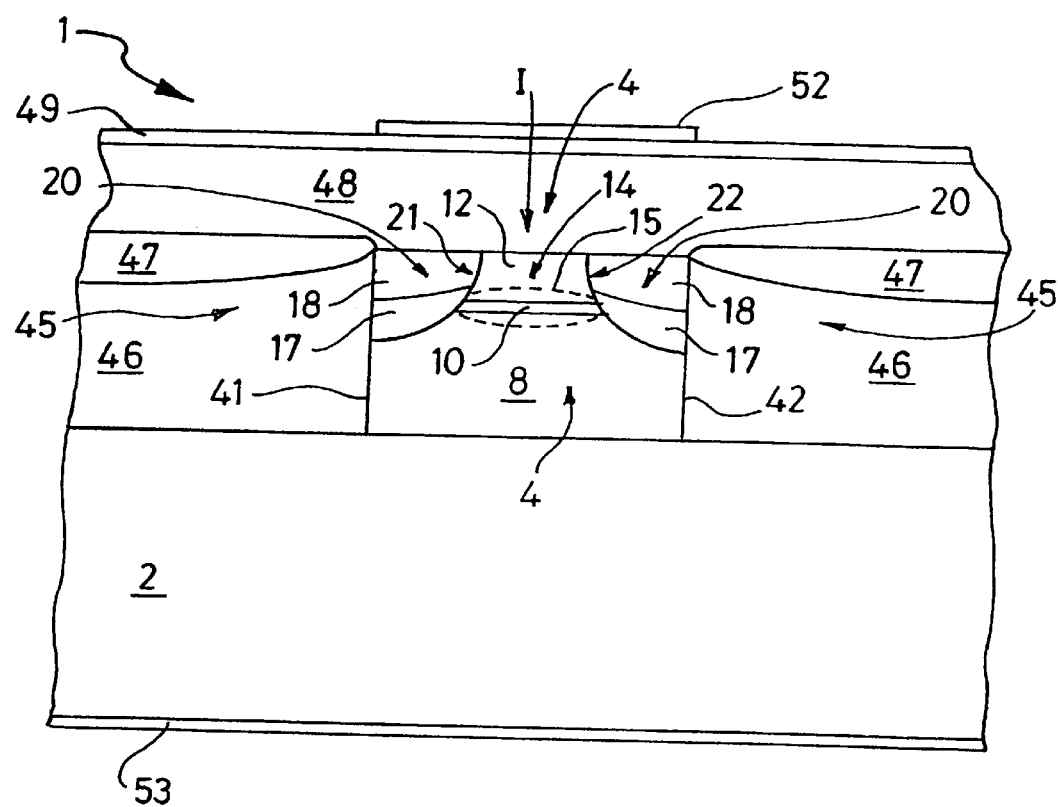
FIG. 1 is a schematic cross-section of a buried heterostructure semiconductor laser device according to a first embodiment of the invention, comprising an active layer within a buried mesa stripe, a current conduction region for channelling current to the active layer, and current confinement regions consisting of two distinct current confinement structures on each side of the heterostructure.

FIG. 1 shows, not to scale, a cross-section of a semiconductor device 1 according to the invention, here a buried heterostructure laser diode suitable for use as a transmitter in a high speed fibre-optic link operating at 1.55 $\mu$m. Currently, high speed links operate at 2.5 or 10 Gbits/s, and bit rates of up to 40 Gbits/s have been demonstrated in the laboratory.

Figure 2:
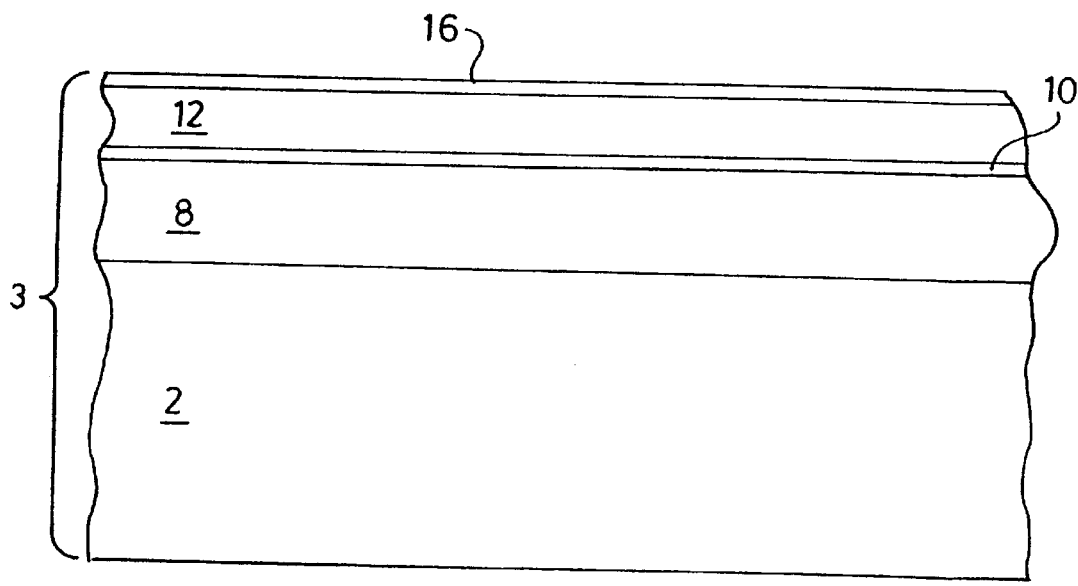
FIGS. 2 to 4 show process steps for creating a first current confinement structure adjacent the mesa stripe, formed from a p-n junction current blocking layer.

Referring now also to FIG. 2, the device 1 is formed starting from a wafer 3 that is 32 mm square, and that has an n$^{---}$-InP substrate 2 doped to around $10^{19}$/cc, on which is grown a 2 $\mu$m thick n$^-$-InP buffer layer 8 doped to around $10^{18}$/cc. An active layer 10 is grown on the buffer layer 8 according to known techniques for fabricating planar active lasers for a laser diode—the active layer could be a bulk region or a strained multiple quantum well (SMQW) structure. An example of an SMQW device is discussed in W. S. Ring et al, Optical Fibre Conference, Vol. 2, 1996 Technical Digest Series, Optical Society of America. The type of active layer employed is not critical to the invention.

In the present example, the device 1, for example a laser diode, has a quaternary In$_x$Ga$_{1-x}$As$_{1-y}$P$_y$ active layer 10 that may be between about 100 nm to 300 nm thick. The active layer 10 is topped by another buffer layer 12, also called a P$_0$-layer, formed from p$^+$-InP, grown to be between about 400 nm to 1 $\mu$m thick.

Although not illustrated, a DFB grating for the device 1 can be contained in the n$^-$-InP buffer layer 8 or in an additional p-InGaAsP grating layer.

Figure 3:
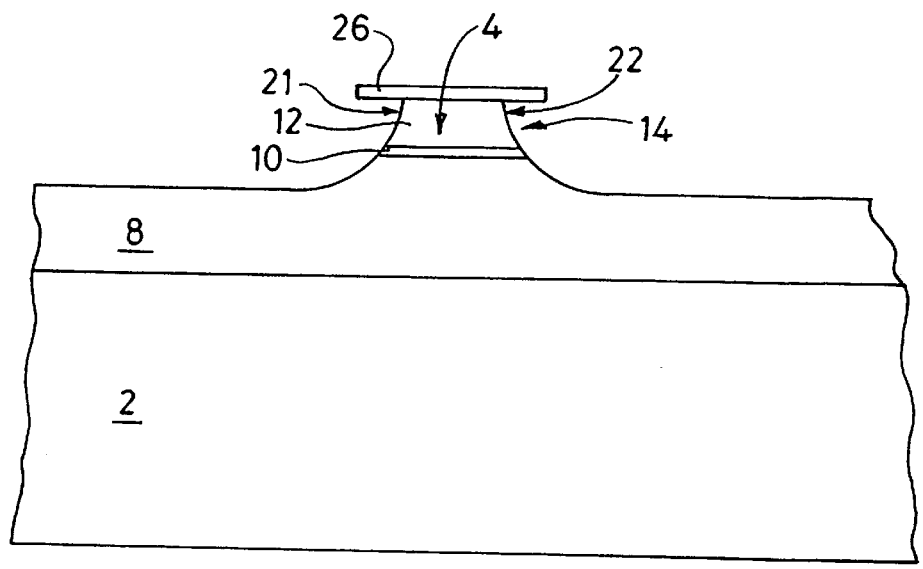
Figure 4:
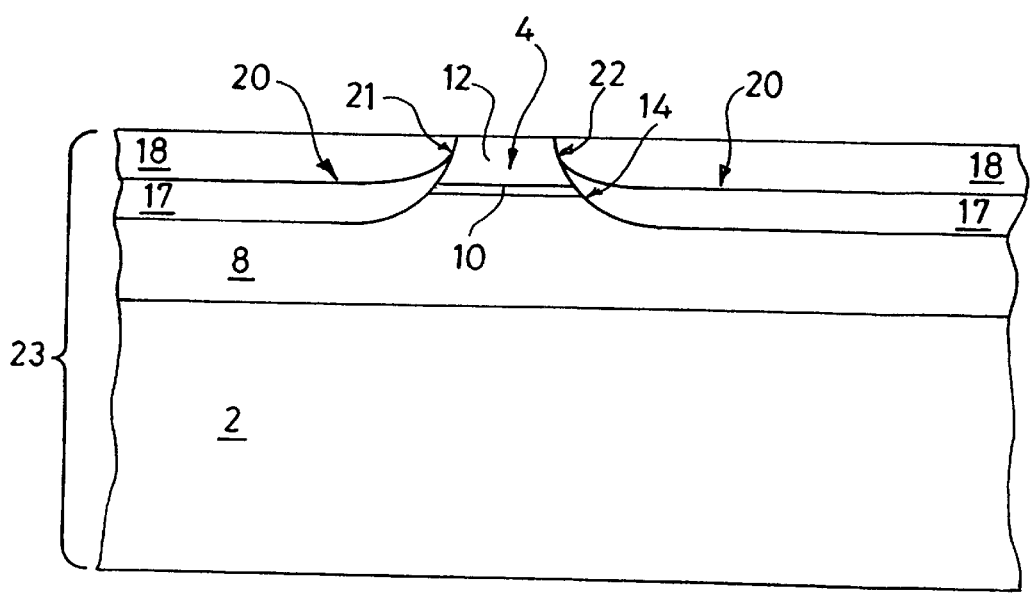

Then, using well-known fabrication technology, the wafer 3 is coated with an oxide layer 16 as shown in FIG. 2. The oxide layer may be SiO$_2$ deposited by a plasma enhanced chemical vapour deposition (PECVD) process. It should, however, be noted that silicon nitride would be a suitable alternative choice to SiO$_2$. As shown in FIG. 3, the oxide layer 16 is photolithographicly patterned with a photoresist to leave a patterned mask 26, and etched to remove in areas not covered by the patterned mask the P$_0$-layer 12, the active layer 10, and all but 200 nm of the buffer layer 8. In this example layers 8, 10 and 12 are removed in a wet-etch process that undercuts the patterned mask 26 by about 200 nm to 500 nm.

The layers 8, 10, and 12 are removed in all areas except along a mesa stripe 14 structure that extends perpendicular to the plane of the drawing, and which rises above the level of the substrate 2. The mesa stripe 14 has left and right opposite side walls 21,22 that together with the buffer layer 8 and the P$_0$-layer 12 form a current conduction region 4 for an applied current I, and have the effect of guiding an optical mode 15 along the active layer 10 within the stripe 14.

The width of the mesa stripe 14 varies depending on the particular device, but for opto-electronic devices such as laser diodes, the mesa stripe 14 is usually between 1 $\mu$m and 10 $\mu$m wide. The mesa stripe 14 rises 1 $\mu$m to 2 $\mu$m above the surrounding substrate 2.

A first current blocking structure 20 is then grown on the etched device up to approximately the level of the patterned mask 26, first with a p-doped InP layer 17, and then with an n-doped InP layer 18. The thicknesses of the p-doped and n-doped layers are similar. These InP layers 17,18 form a p-n junction that is insulating when the device 1 is forward biased.

After deposition of the first current blocking structure 20, the PECVD oxide layer 16 is removed with 10:1 buffered HF from the mesa stripe 14 to expose again the P$_0$-layer 12. This leaves an etched and coated wafer 23 comprising the substrate 2, the mesa stripe 14 and the first current blocking structure 20 abutting the opposite sides 21,22 of the mesa stripe 14.

The etched and coated wafer 23 is coated with an oxide layer, such as an SiO$_2$ layer or silicon nitride layer deposited by PECVD, which is then pholithographicly patterned and etched as described above to leave a second patterned mask 36. The second patterned mask 36 is aligned along the length of the mesa stripe 14, but is wider than the mesa stripe, so that the mask 36 and extends at least 1 $\mu$m and preferably 2 $\mu$m laterally beyond the junction between each mesa side 21,22 and a top surface 37 of the P$_0$-layer 12.

Figure 5:
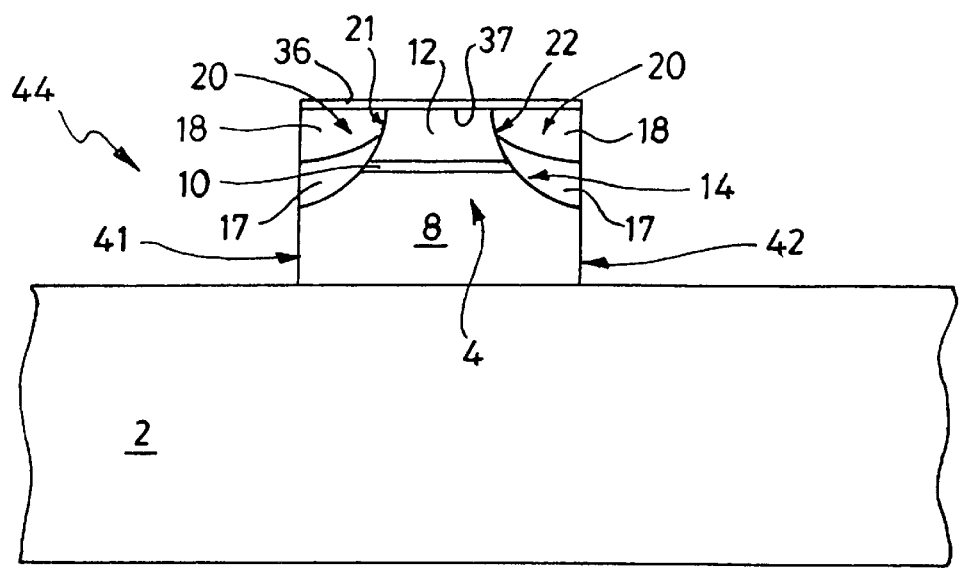
FIGS. 5 and 6 show process steps for creating a second current confinement structure adjacent the first current blocking layer, formed from a metal-doped current blocking layer.
Figure 6:
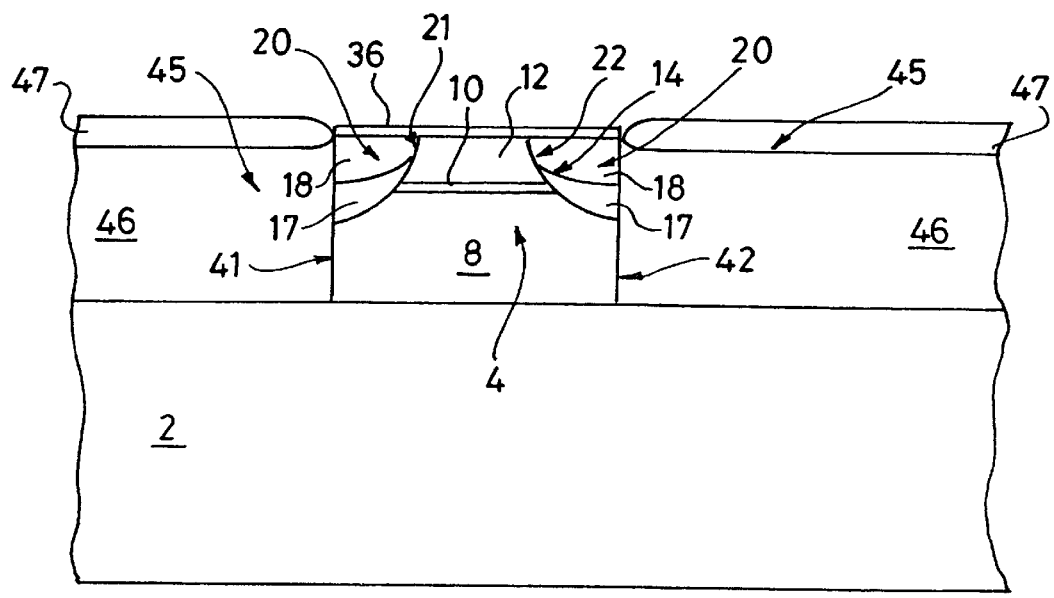
Figure 7:
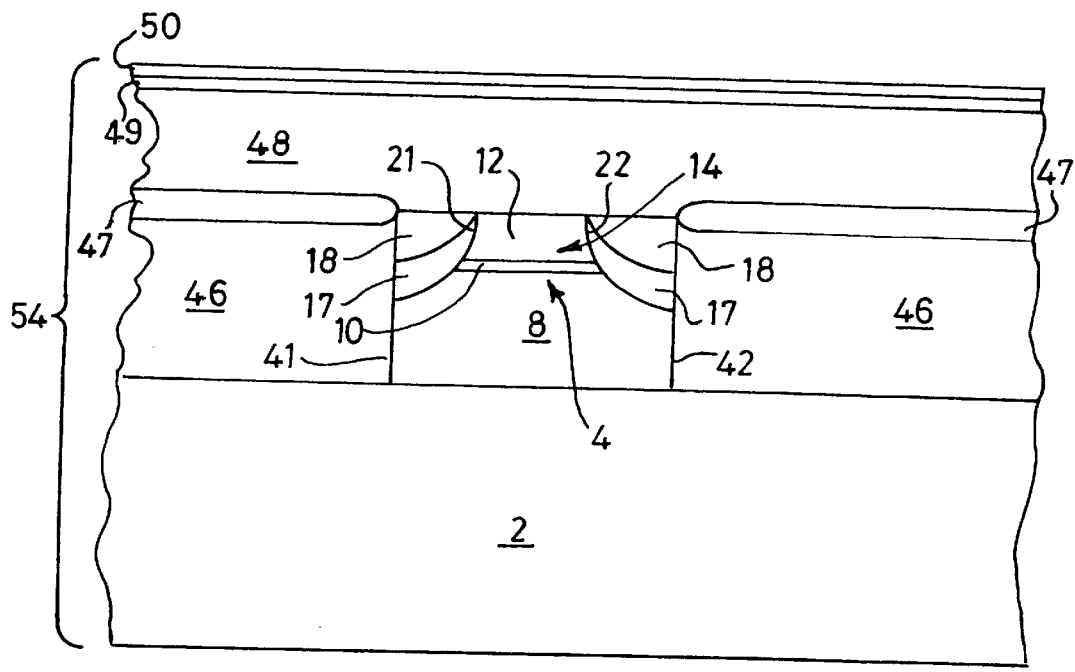
FIG. 7 shows the formation of cladding, cap, and electrical contact layers leading to the device of FIG. 1.

The P$_0$-layer 12, the active layer 10, and preferably all of the buffer layer 8 are then removed in a reactive ion plasma dry etch process, which cuts substantially vertical sides walls 41,42 through these layers. The resulting etched structure 44 is shown in FIG. 5.

A second current blocking structure 45 is then grown using a MOVCD process on the exposed semiconductor surfaces of the etched structure 44. This current blocking structure is formed from a Fe-doped InP-based layer 46 topped by an n$^-$-InP layer 47. Alternatively, instead of iron, the metal dopant could be ruthenium or chromium. The thickness of the Fe-InP layer is about 1 $\mu$m to 2 $\mu$m, so that this extends almost up to the mask 36. The n-InP layer is about 200 nm to 500 nm thick, and extends just above the mask 36. The second current blocking structure 45 therefore abuts the side walls 41,42 of the first current blocking structure 20 along a substantially vertical interface, and the first current blocking structure 20 abuts the side walls 21,22 of the mesa stripe 14. Because the second current blocking structure 45 extends deeper within the current blocking region than the first current blocking structure 20, the second current blocking structure 45 also abuts a portion of the n-InP buffer layer 8 along a substantially vertical interface.

The n$^-$-InP layer 47 in the second blocking structure 45 blocks the conduction of holes through the blocking structure as well as acting as a barrier to the diffusion of Zn into the metal-doped layer 46.

After the growth of the second current confinement structure 45, the patterned mask 36 is removed with 10:1 buffered HF from the mesa stripe 14 to expose again the P$_0$-layer 12.

A cladding layer 48 formed from p$^+$-InP is then grown above the P$_0$-layer 12 and current blocking structures 20,45 to a thickness of about 2 µm to 3 µm. The final semiconductor layer is a 100 nm to 200 nm thick ternary cap layer 49 deposited on the cladding layer 48. The cap layer 49 is formed from p$^{++}$-GaInAs, highly doped to around 10$^{19}$/cc, in order to provide a good low resistance ohmic contact for electrical connection to the current conduction region 4 of the mesa stripe 14. As an alternative to a ternary cap layer, it is possible to use a quaternary InGaAsP cap layer.

Metal 50 is then vacuum deposited on the cap layer 49 using well known techniques in two stages, first with a TiPt layer that is patterned using a lift-off process, and then final depositing of a TiAu layer, followed by metal wet etch in a photolithographically defined areas. The remaining TiAu layer forms a contact pad 52 with good ohmic contact through the cap layer 49.

The resulting wafer 54 is then thinned to a thickness of about 70 µm to 100 µm in a standard way, in order to assist with cleaving. The thinned wafer is then inscribed and cleaved in a conventional process first transversely into bars about 350 µm wide, and then each bar is cleaved into individual devices 200 µm wide. The cleaved device 1 is about 350 µm long (i.e. in the direction of the mesa 14) and about 200 µm wide.

A Ti/Au metal layer 53 is then deposited by sputtering on the rear surface of the wafer, so enabling the device to be soldered onto a heat sink.

Although not shown, after testing the device 1 may be packaged in an industry standard package, with a single mode optical fibre coupled with a spherical lens to an output facet of the laser diode, and with gold bond wires soldered onto the metalized contact 52.

The InGaAs/InP device 1 described above therefore incorporates a compound current confinement region formed from a reverse-biased p-n structure nearest the active region 10, and further away from the active region 10, a metal-doped InP-based layer. The p-n structure nearest the active region provides superior temperature performance, compared with a purely metal-doped current confinement region, while at the same time excess leakage current through the first current confinement structure at high operating frequencies due to parasitic capacitance from the reverse-biased diode structure is reduced owing to the reduced volume or amount of such a structure. Therefore, as will be described in further detail below, the invention provides a high resistivity current confinement region, and low leakage currents, across a wide range of operating temperatures. The invention also permits the use of higher drive voltages, which are useful in achieving high-speed operation.

Figure 8:
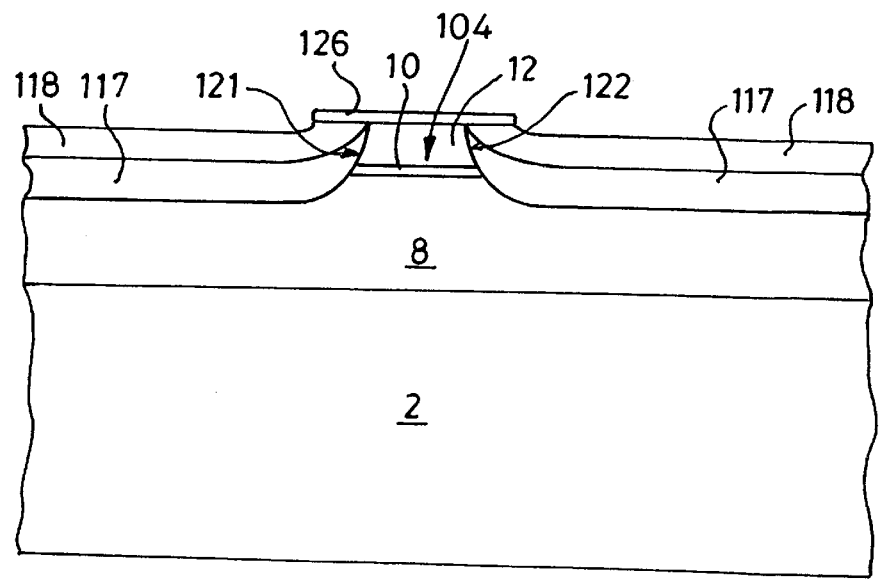
FIGS. 8 to 10 show process steps for a second embodiment of the invention.
Figure 9:
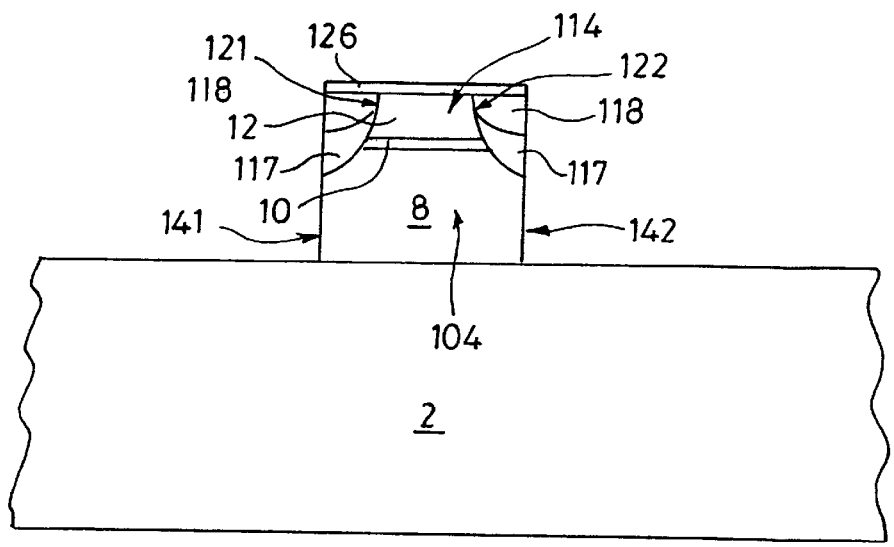
Figure 10:
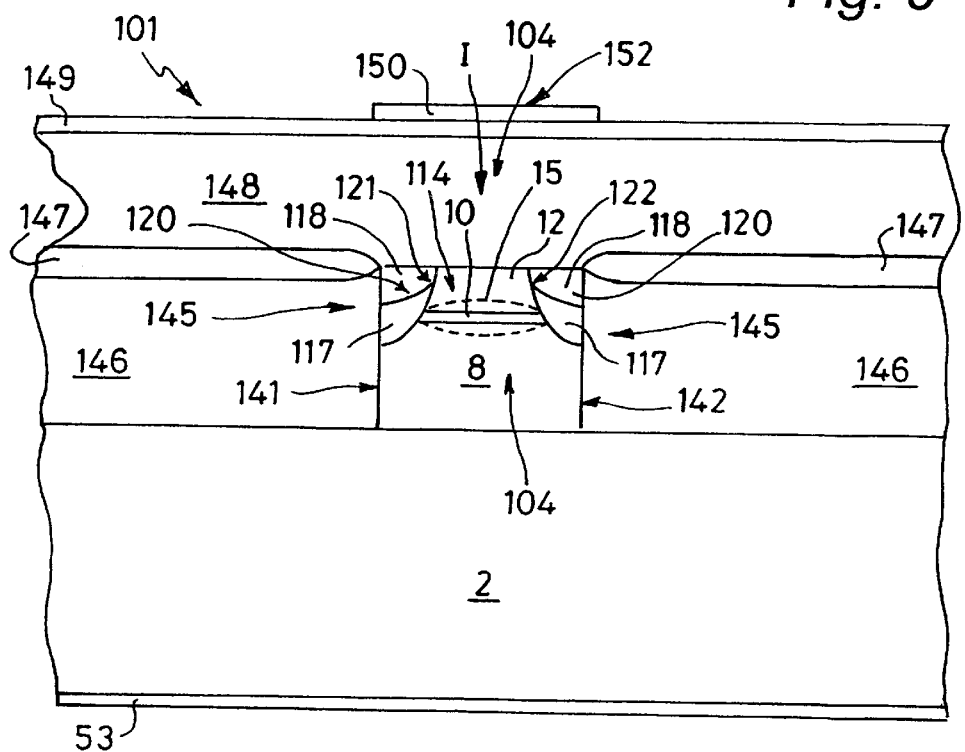

FIGS. 8 to 10 show how the process described above may be modified, in a second embodiment 101 of the invention, where features corresponding with those of FIGS. 1 to 7 are given similar reference numerals incremented by 100. The process used to create the second embodiment 101 differs from that used to create the first embodiment 1 in that only one patterned inorganic mask 126 need be deposited on the wafer. This mask is used in the modified process in such a way that the mask 126 assures the self-alignment of the first current blocking structure 120 with respect to the second current blocking structure 145.

Here, the mask 126 is wider than the corresponding patterned mask shown in FIG. 3. However, the layers of the first current blocking structure 120, the p-doped InP layer 117 and n-doped InP layer 118, can still be grown up approximately to the level of the mask 126. The mask 126 is wide enough so that width of the first current blocking layer beneath the mask is sufficient for good high-frequency performance, as described above. Therefore, the first current blocking structure 120 and underlying buffer layer 8 outside the area of the mask 126 can be removed in a reactive ion plasma etching process, as shown in FIG. 9.

The wafer is then processed in a similar manner to the first embodiment. The second current blocking structure 145 is formed with a 1 µm to 2 µm thick Fe-doped InP layer 146, overlain with a 200 nm to 500 nm thick n$^-$-InP layer up to about the level of the top of the mesa strip 114. The mask 126 is then removed, followed by formation of the cladding layer 148, cap layer 149, metallic contact layer 150, and formation of a contacts 152,53 above the mesa stripe 114 and the substrate 2.

Figure 11:
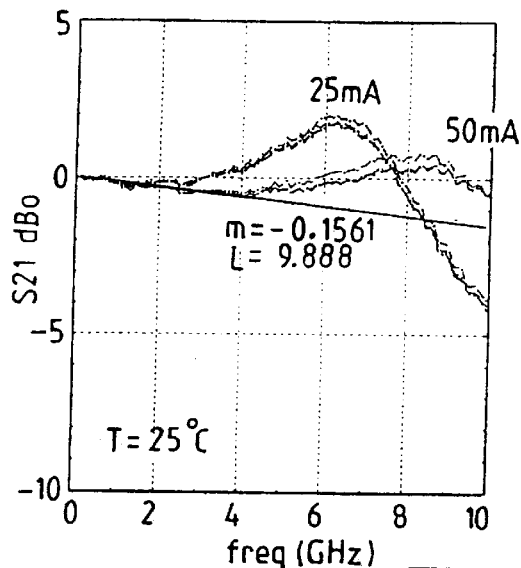
FIGS. 11 and 12 show plots of small signal response against operating frequency at respectively 25° C. and 85° C. for the laser device of FIG. 1.
Figure 12:
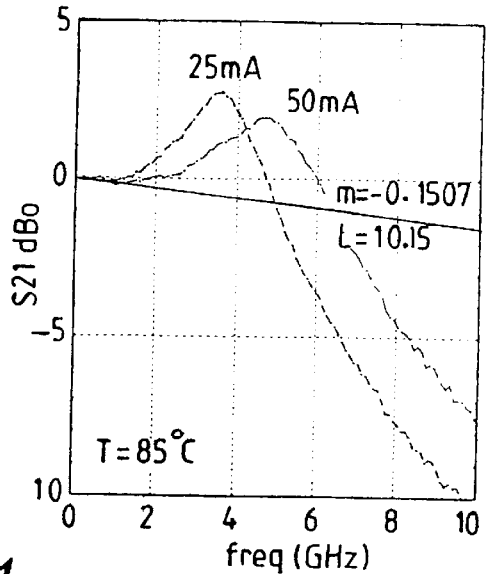
Figure 13:
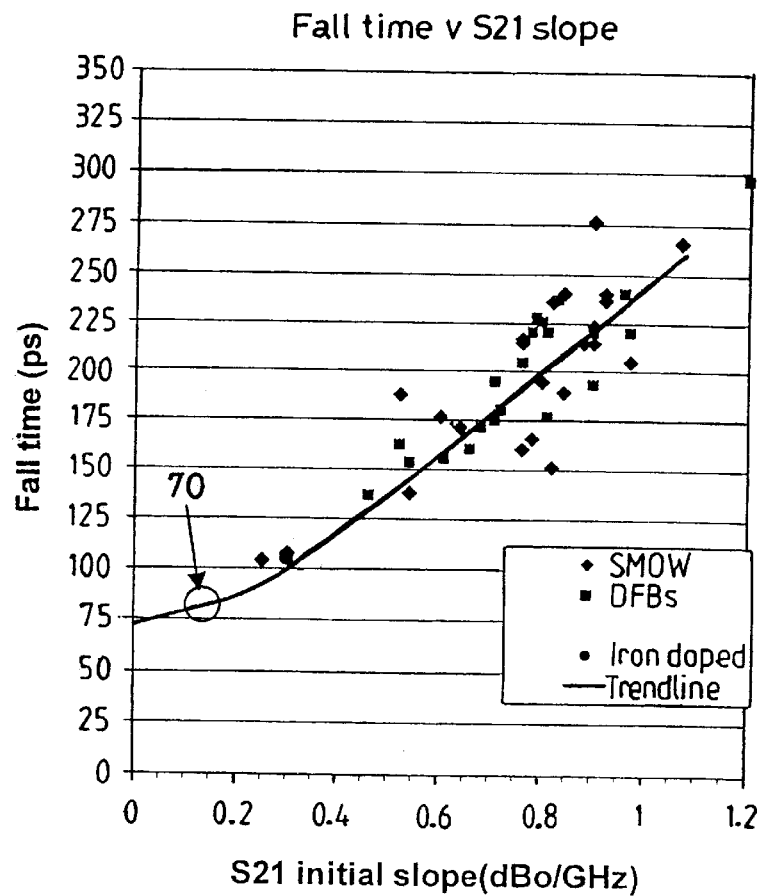
FIG. 13 shows a plot of fall time against small signal response for the laser device of FIG. 1, and for a various types of known semiconductor laser device.

The performance of a semiconductor laser diode according to the invention is shown in FIGS. 11 to 13. The small signal response against operating frequency at respectively 25° C. and 85° C. is shown respectively in FIGS. 11 and 12, as a plot of the small signal initial slope S21 in dBo (dB optical) against operating frequency in GHz. The small signal drop off crosses −3 dB near 15 GHz. The signal fall time (90% to 10%) was measured to be about 85 ps. This is much better than the signal fall time of a standard buried heterostructure laser diode device with only a p-n junction current blocking layer either side of the mesa stripe, which is typically between 120 ps to 250 ps.

In order to test the efficiency of the laser diodes, dc measurements of the slope of the light output vs drive current were made at 25° C. and at 85° C. The slopes at typical drive currents of 8.5 mA (at 25° C.) and 29 mA (at 85° C.) were measured and then divided by the slopes at about 1 mA. The ratio of these slopes is a measure of the device's efficiency, which was determined to be 0.86 at 25° C. and 0.71 at 85°. For devices of this sort, efficiency figures such as this are considered to be very good.

FIG. 13 shows a plot of fall time for the laser device of FIG. 1, within the circle labelled with reference numeral 70, compared against a range of other types of semiconductor laser devices. As can be seen, the typical fall time and S21 initial slope characteristics are very good.

Semiconductor devices according to the invention provide a high operating bandwidth and good lifetime characteristics. The process steps involved may be similar to other standard steps used in the fabrication of such devices. There is no need for additional expensive processing equipment. The tolerances in the alignment of the mask or masks used to form the two current confinement structures are not unduly difficult to achieve using standard processing equipment.

Although the present invention has been described specifically for the example of a laser diode, the invention is applicable to any high speed semiconductor device where current blocking regions help to channel current through a current conduction region, for example ridge waveguide type lasers, pump lasers, edge emitting light emitting diodes, edge photodetectors, surface emitting laser and light emitting diodes, and top-entry photodetectors. Another example is an optical waveguide with a split into two waveguides at a Y-junction. This may have electrically driven or modulated active optical regions in two or three of the arms of the "Y", for example an optical amplifier or modulator. It may then be desirable to provide a current blocking region at the junction of the three arms, where there may be three separate conduction regions.

The invention described above have been described for a device based on an n$^{--}$-InP substrate, and having a first current blocking structure formed from a reverse biased p-n junction in laterally adjacent contact with the active layer structure, and a second current blocking structure formed from a metal-doped/n⁻ InP layer structure in laterally adjacent contact with the first current blocking structure. However, it is to be appreciated that the invention can also be applied to other types of devices, for example those based on a $p^{++}$-InP substrate. In this case, the first current blocking structure may be a reverse biased n-p junction, and the second current blocking structure may include a metal-doped/$p^+$ InP layer structure in laterally adjacent contact with the first current blocking structure. The term "p-n junction current blocking structure" therefore includes such a reverse biased n-p junction.

What is claimed is:

1. A semiconductor device comprising:
   an active layer grown on a buffer layer;
   a current conduction region; and
   a current confinement region adjacent said current conduction region,
   wherein said current conduction region and said current confinement region are arranged to channel electric current to said active layer,
   wherein said current confinement region includes both a metal-doped current blocking structure and a p-n junction current blocking structure, said p-n current blocking structure being between said current conduction region and said metal-doped current blocking structure, and
   wherein said metal-doped blocking structure abuts a portion of said buffer layer along a substantially vertical interface.

2. A semiconductor device as claimed in claim 1, the device including a substrate, a mesa stripe on the substrate and an active layer in the mesa stripe, in which the current conduction region channels current through the active layer.

3. A semiconductor device as claimed in claim 2, in which the mesa stripe has one or more side walls that rise above the substrate, the active layer extending to the side wall(s) and the active layer being covered at the side walls by the p-n blocking structure.

4. A semiconductor device as claimed in claim 3, in which said mesa side walls slope laterally away from said active layer towards said metal-doped current blocking structure.

5. A semiconductor device as claimed in claim 1, in which said metal-doped current blocking structure abuts said p-n current blocking structure along a substantially vertical interface.

6. A semiconductor device as claimed in claim 1, in which the device is a buried heterostructure laser diode device.

7. A semiconductor device as claimed in claim 1, in which the device is formed from III–V semiconductor materials.

* * * * *